United States Patent
Hecker (12)

(10) Patent No.: US 6,182,546 B1
(45) Date of Patent: Feb. 6, 2001

(54) APPARATUS AND METHODS FOR SEPARATING MICROELECTRONIC PACKAGES FROM A COMMON SUBSTRATE

(75) Inventor: Walter G. Hecker, Fremont, CA (US)

(73) Assignee: Tessera, Inc., San Jose, CA (US)

( * ) Notice: Under 35 U.S.C. 154(b), the term of this patent shall be extended for 0 days.

(21) Appl. No.: 09/034,513

(22) Filed: Mar. 4, 1998

Related U.S. Application Data

(60) Provisional application No. 60/040,022, filed on Mar. 4, 1997.

(51) Int. Cl.[7] .................................................. B26D 3/00
(52) U.S. Cl. .................................... 83/56; 83/76; 83/365; 83/675; 83/676
(58) Field of Search .................... 83/56, 72, 73, 83/365, 663, 675, 676, 698.41

(56) References Cited

U.S. PATENT DOCUMENTS

| | | |
|---|---|---|
| 2,595,402 * | 5/1952 | Morris .................................. 33/27.12 |
| 2,612,689 * | 10/1952 | Kirkman et al. ...................... 33/27.12 |
| 3,537,169 | 11/1970 | Eigeman et al. . |
| 3,562,058 | 2/1971 | Boyd . |
| 3,614,369 * | 10/1971 | Medley .................................. 83/175 |
| 3,797,340 * | 3/1974 | Pereman ............................. 83/698.41 |
| 5,148,266 | 9/1992 | Khandros et al. . |
| 5,169,804 | 12/1992 | Schwartzbauer . |
| 5,288,663 | 2/1994 | Ueki . |
| 5,362,681 | 11/1994 | Roberts, Jr. et al. . |
| 5,605,844 | 2/1997 | Oki et al. . |
| 5,622,900 | 4/1997 | Smith . |
| 5,654,204 | 8/1997 | Anderson . |
| 5,659,952 | 8/1997 | Kovac et al. . |

\* cited by examiner

Primary Examiner—M. Rachuba
(74) Attorney, Agent, or Firm—Lerner, David, Littenberg, Krumholz & Mentlik, LLP

(57) ABSTRACT

An apparatus for excising microelectronic packages assembled to a common substrate includes a mechanical element which travels over a path defined on the common substrate, a castor element pivotally mounted to the mechanical element for movement about a pivot axis, and a cutting wheel rotatably mounted to the castor element so as to provide a castoring action for the cutting wheel. The cutting wheel has an asymmetrical cutling edge which selectively engages the common substrate so that when the mechanical element guides the cutting wheel over the path, the cutting edge severs the common substrate to provide one or more of the microelectronic packages separate from one another.

26 Claims, 12 Drawing Sheets

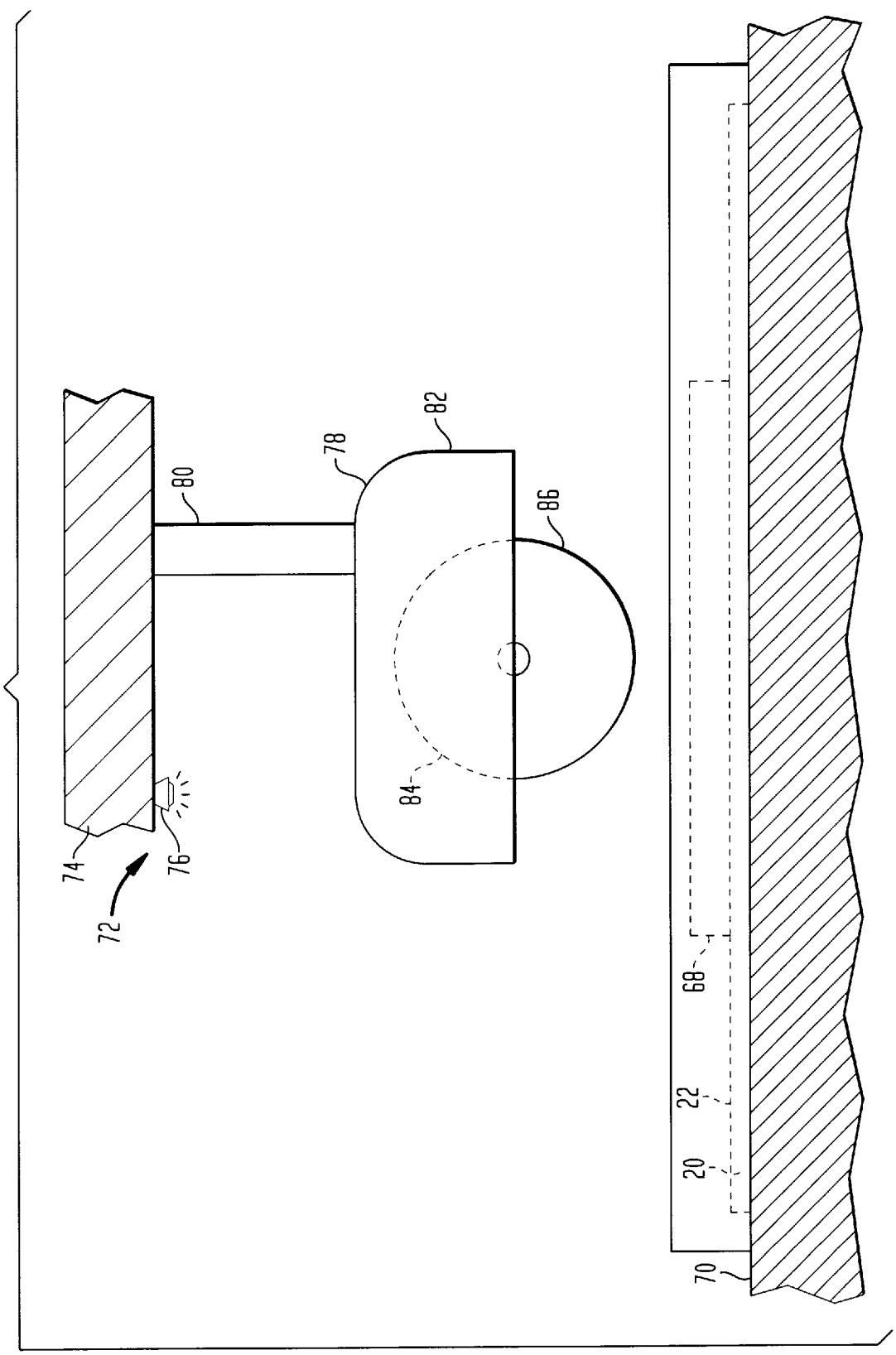

APPARATUS AND METHODS FOR SEPARATING MICROELECTRONIC PACKAGES FROM A COMMON SUBSTRATE

CROSS REFERENCE TO RELATED APPLICATIONS

This application claims benefit of U.S. Provisional Application Ser. No. 60/040,022 filed Mar. 4, 1997, the disclosure of which is hereby incorporated by reference herein.

FIELD OF THE INVENTION

The present invention relates generally to microelectronic packages and more specifically relates to devices and methods for separating one or more microelectronic packages from a common substrate.

BACKGROUND OF THE INVENTION

A semiconductor chip is generally connected to an external circuit element, such as a printed circuit board, through contacts on the front face of the chip. For example, in the tape automated bonding process (hereinafter referred to as the "TAB" process), a flexible dielectric sheet, such as a thin foil of polyimide, is provided with one or more bond windows and an array of metallic leads on one surface thereof. Each lead has one end integrally connected to terminals on a dielectric sheet and an opposite end extending from the dielectric sheet so that the outermost ends of the leads project beyond the bond windows. The dielectric sheet is then juxtaposed with the semiconductor chip so that the bond windows are aligned with the contacts on the chip and so that the outermost ends of the leads overlie the front face of the chip. The leads are then bonded to the contacts of the chips using bonding techniques, such as ultrasonic or thermocompression bonding. After the bonding step, the terminals may be connected to an external circuit element.

Certain embodiments of commonly assigned U.S. Pat. No. 5,659,952, the disclosure of which is hereby incorporated by reference herein, disclose methods of manufacturing a plurality of semiconductor chip packages by assembling a plurality of semiconductor chips on a common substrate, such as a substantially continuous sheet of flexible dielectric material. The common substrate preferably has a plurality of connection components which are spaced lengthwise or in a matrix arrangement on the common substrate. Each connection component preferably includes terminals and flexible leads extending therefrom for electrically connecting the terminals with contacts on a front face of a semi-conductor chip. Before semiconductor chips are assembled to respective connection components on the common substrate, a plurality of compliant pads are attached to a top surface of each connection component whereby any two adjacent compliant pads define a channel therebetween. The compliant pads preferably include a resilient material such as a silicone elastomer. Next, the front contact bearing faces of the respective semiconductor chips are abutted against the array of compliant pads and the contacts are electrically connected to the terminals by bonding the flexible leads to the contacts. A compliant filler, such a curable liquid elastomer, may then be provided in the channels between the front face of the semiconductor chips and the top surface of the common substrate while the semiconductor chips and the common substrate are held in place. The curable liquid elastomer is then cured to form a substantially uniform planar compliant layer between the chip and the dielectric film.

After a plurality of semiconductor chip packages have been manufactured using the techniques described above, the individual microelectronic packages must be separated from the common substrate, such as by severing the common substrate to free the individual packages. As used herein, the term semiconductor chip package means a semiconductor chip which has been assembled to a portion of the common substrate, whereby an individual chip package includes the semiconductor chip and a portion of the common substrate which has been severed.

A number of methods have been used for severing or cutting the common substrate so as to separate the one or more microelectronic packages therefrom. One effort involves using a stationary rotating cutting wheel, such as a wafer saw which is colloquially referred to as a "salami slicer". However, the results achieved using salami slicers have proven to be disappointing because the common substrate material and the encapsulant material tend to act as brake pads which squeeze on the lateral sides of the rotating cutting wheel. This occurrence slows rotation of the cutting wheel and heats the cutting wheel and the package elements. The salami slicer also can move the common substrate out of planarity which results in the formation of an irregular cut line. Another method for separating microelectronic packages from a common substrate includes using a circular saw. This method has proven to be very fast and the cuts are generally straight and reasonably smooth. However, this particular method produces debris, thereby requiring another process step to clean the separated microelectronic packages. Further methods include using ultrasonic knives having cutting edges which are symmetrical or asymmetrical in configuration. However, none of the various blades and cutting speeds yield an acceptable straight cut line. Routers have also proven to be somewhat effective at separating microelectronic packages from common substrates, however, the method typically leaves the encapsulant layer torn and frazzled.

Thus, there is a need for improvement in cutting apparatus and methods for efficiently and reliably separating microelectronic packages from a common substrate after they have been manufactured in a plurality of rows and/or columns on the common substrate.

SUMMARY OF THE INVENTION

In one preferred embodiment of the present invention, an apparatus for separating one or more microelectronic packages which are assembled to a common substrate includes a mechanical element which travels over a path defined on the common substrate. Each microelectronic package preferably includes one or more microelectronic elements, such as semiconductor chips, assembled to a section of the common substrate. The common substrate may include a flexible dielectric sheet, such as a flexible polymeric film having a plurality of conductive terminals thereon with a plurality of conductive traces integrally connected to and extending from the terminals. Typically, the microelectronic elements are electrically interconnected with the flexible dielectric sheet by electrically interconnecting the conductive traces with contacts on front faces of the respective microelectronic elements. Each microelectronic package may also include a plurality of compliant pads which space the chips from the common substrate and an encapsulant, such as a cured silicone elastomer between the chips and the common substrate.

The cutting apparatus preferably includes a mechanical element, such as a robotic arm, which travels over a path defined on the common substrate. The mechanical element may be connected to a moving element for moving the mechanical element over the defined path. The moving element may include an electro-mechanical element such as a robotic device or may include a series of cams. The cutting apparatus also includes a castor element pivotally mounted to the mechanical element for movement about a pivot axis and a cutting wheel rotatably mounted to the castor element, thereby providing a castoring action for the cutting wheel so that the cutting wheel follows the track of the mechanical element. In certain embodiments the castor element includes a pivoting shaft having an upper end pivotally mounted to the castor element and a lower end remote therefrom, the lower end including a connecting assembly for rotatably mounting the cutting wheel to the castor element. The lower end of the castor element may be angled with respect to the longitudinal axis of the shaft so that the cutting wheel trails the shaft as the shaft travels along the path defined over the flexible dielectric sheet, thereby further facilitating the castoring action of the cutting wheel. The cutting wheel is rotatably mounted to the castor element so that it is free to rotate about an axis of rotation and within a rotary plane. The axis of rotation of the cutting wheel is preferably offset from the pivot axis of the castor element. The periphery of the cutting wheel is sharpened to provide a cutting edge. In certain embodiments the cutting edge of the cutting wheel is formed symmetrically with respect to the rotary plane of the cutting wheel. However, the cutting edge may also be formed asymmetrically with respect to the rotary plane of the cutting wheel.

The apparatus preferably includes an alignment system for aligning the cutting edge over the common substrate and guiding the cutting edge over the substrate and between the microelectronic packages. In one particular embodiment, the path defined on the common substrate preferably includes a series of fiducial markings which outline a series of straight cut lines which are to be followed by the mechanical element and the cutting wheel. The mechanical element preferably includes an optical element, such as an optical eye, which is capable of recognizing the fiducial markings, aligning the mechanical element over the common substrate and guiding the cutting wheel along the series of straight cut lines between the various microelectronic packages.

During a cutting operation, the mechanical element preferably guides the cutting wheel over the path defined on the common substrate so that the cutting edge of the cutting wheel selectively severs the common substrate along the straight cut lines between the one or more microelectronic packages. The mechanical element and the cutting wheel are movable between a number of positions including a first position in which the cutting edge is remote from and is not in contact with the common substrate and a second position in which the cutting edge engages the common substrate for severing the common substrate. In certain embodiments, the common substrate remains stationary during a cutting operation and the mechanical element and cutting wheel are moved in the X and Y directions relative to the common substrate. In other embodiments, the mechanical element and the cutting wheel remain stationary and the common substrate is moved in the X and Y directions relative thereto.

The cutting apparatus also preferably includes a biasing element for engaging the castor element so as to resiliently urge the cutting edge of the cutting wheel to remain in a position which is parallel to the series of straight line paths defined on the common substrate. The biasing element generally forces or resiliently urges the cutting edge to return to a position which is parallel to the path defined on the common substrate while the cutting edge is in the first position. In other words, the biasing element continuously realigns the cutting edge over the path when the cutting edge is lifted above the common substrate. This continuous realignment is necessary because the lateral forces exerted upon the cutting wheel during a cutting operation will tend to divert the cutting edge from its projected straight line path. The biasing element may include a tension spring connected to the castor element for resiliently urging the cutting edge to return to a known angular position when it is lifted off of the cutting surface. In other embodiments, the biasing element may include a compression spring and a cam element which engages the castor element for maintaining the cutting edge in the desired position. Further embodiments may include a rubber-like mount.

The cutting apparatus may also include a support, such as a cutting surface, for supporting the common substrate and the microelectronic elements assembled thereto during a cutting operation. The cutting surface preferably includes a cut-resistant material having a Shore A durometer rating of approximately 80 to 120. The cutting surface preferably includes a gummy material, such as polyurethane, which generally secured the common substrate in place thereon. The common substrate is preferably abutted directly against the top surface of the cutting surface, with the assembled microelectronic elements being remote from the cutting surface. In other preferred embodiments the rear surfaces of the assembled microelectronic elements may be abutted against the top of the cutting surface, with the common substrate being remote from the cutting surface. The mechanical element preferably provides a downward force upon the cutting wheel of about 6–10 pounds so that the cutting wheel only severs the common substrate without cutting into the cutting surface. In other embodiments, the mechanical element is arranged to limit downward movement of the cutting wheel to a distance which is generally equal to the thickness of the common substrate. By limiting the range of downward movement of the cutting wheel, the cutting edge will only cut through the common substrate without cutting into the cutting surface which supports the common substrate. It is generally desirable to avoid cutting into the cutting surface because this will rapidly dull the cutting edge and cause the cutting wheel to divert from the straight-line path defined over the common substrate.

The cutting apparatus may also include one or more support rollers which are rotatably mounted on one or both sides of the cutting wheel for supporting the cutting wheel and engaging portions of the common substrate which are adjacent the cutting wheel. The support rollers guide the cutting wheel over the chip packages and exert a downward force upon the common substrate on both sides of the cut line to reduce separation of the common substrate as the substrate is being cut. In certain embodiments the one or more support rollers are rotatably mounted to the castor element and rotate independently of the cutting wheel. The one or more support rollers preferably include a compliant material, such as rubber or neoprene.

In accordance with other preferred embodiments of the present invention, a method for separating microelectronic packages assembled to a common substrate includes providing one or more microelectronic elements assembled to a common substrate and defining a path on the common substrate, such as a series of straight lines outlined on the common substrate by fiducial markings. The method includes providing a cutting apparatus having a cutting wheel with a cutting edge, the cutting wheel being castor mounted to the cutting apparatus. The cutting apparatus is movable between a first position in which the cutting edge is remote from the common substrate and a second position in which the cutting edge engages the common substrate for severing the substrate. The cutting wheel is preferably guided over the path defined on the common substrate so as to sever the common substrate between the microelectronic packages to provide individual microelectronic packages which are separate from one another. Some of the separate microelectronic packages may include two or more microelectronic elements. During the guiding step, the cutting edge engages the common substrate so as to sever the common substrate to provide one or more of the microelectronic packages which are separate from one another. During the guiding step, the cutting apparatus is maintained in a substantially stationary position and the common substrate is moved relative to the cutting apparatus. However, in other preferred embodiments the common substrate may be maintained in a stationary position while the cutting apparatus is moved relative to the common substrate for severing the common substrate.

The method also includes resiliently urging the cutting edge to remain in a position parallel to the path defined on the common substrate. As mentioned previously, the cutting edge is resiliently urged to remain on the path by a biasing element which returns the cutting wheel into a known angular position when the cutting wheel is disengaged from the common substrate. The biasing element may include a tension spring or a compression spring and cam follower which engages a portion of the cutting apparatus, such as a concave portion designed for engaging with the cam follower.

The method may also include the step of applying a downward force upon the castor element and the cutting wheel so that the cutting edge is capable of cutting completely through the common substrate. The level of downward force is preferably maintained within a predetermined range so that the cutting edge severs the common substrate without cutting into the cutting surface. The exact level of the downward force may be modified in response to the composition of the materials being cut. In other preferred embodiments, the cutting apparatus may include an element for moving the cutting wheel downward over a predetermined distance so that the cutting edge engages the common substrate without moving into engagement with the cutting surface.

These and other objects, features and advantages of the present invention will be more readily apparent from the detailed description of the preferred embodiment as set forth below and when taken in conjunction with the accompanying drawings.

BRIEF DESCRIPTION OF THE DRAWINGS

FIG. 6 shows a perspective side view of a cutting apparatus including a cutting wheel for separating one or more microelectronic packages from a common substrate according to preferred embodiments of the present invention.

DETAILED DISCLOSURE OF THE PREFERRED EMBODIMENTS

Figure 1A:
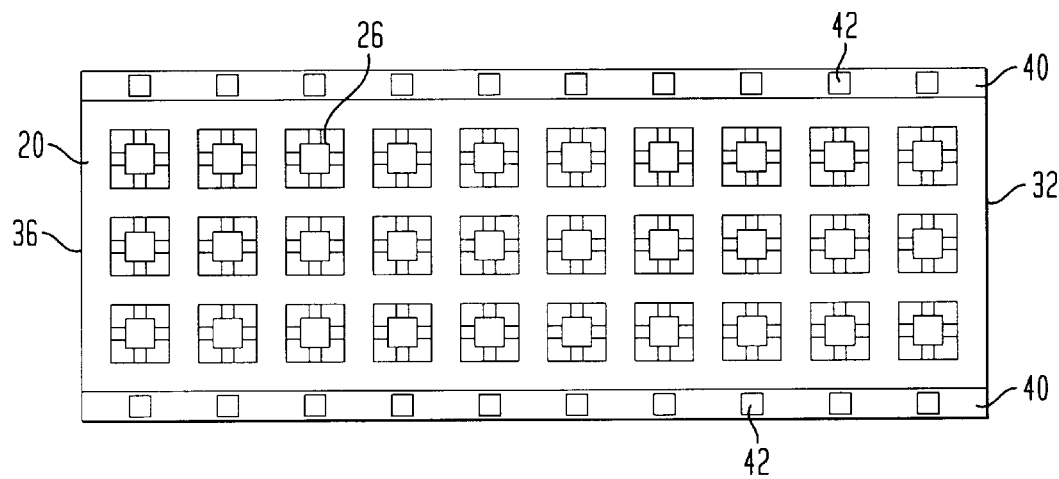
FIG. 1A shows a top view of a common substrate used to assemble a plurality of microelectronic packages according to preferred embodiments of the present invention.
Figure 1B:
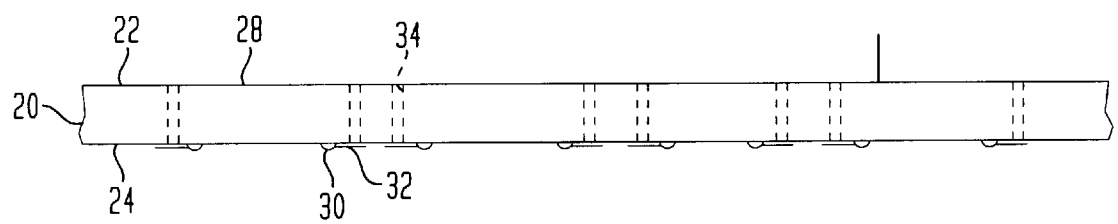
FIG. 1B shows a fragmentary side view of the common substrate shown in FIG. 1A.

One preferred embodiment of the present invention provides an apparatus for separating one or more microelectronic packages, from a common substrate after the packages have been assembled on the common substrate. Referring to FIGS. 1A and 1B, the common substrate 20 is preferably a strip which is cut from a continuous reel of flexible film, such as a flexible sheet-like dielectric film having a first surface 22 and a second surface 24. The common substrate 20 is preferably formed from a polymeric material, such as KAPTON (E) available from DuPont Chemical Corporation, and has an approximate thickness of between 25 to 75 microns. In the particular embodiment shown in FIG. 1A, the common substrate 20 includes a plurality of connection components 26 which are arranged in a 3×10 array. Each connection component 26 has an attachment surface 28 on the first surface 22, a plurality of conductive terminals 30 accessible at the second surface 24 and flexible leads 32 integrally connected to the terminals 30. Each connection component 26 serves as a compliant interface for a microelectronic element (not shown), such as a semiconductor chip, so that the microelectronic element may be electrically connected to an external circuit element. Each connection component 26 also preferably includes bond windows 34 for accessing the leads 32 in order to bond the flexible leads 32 to contacts on a microelectronic element during a bonding operation, as will be discussed in more detail below. The common substrate 20 preferably has a first end 36 and a second end 38 and side portions 40 which include sprocket holes 42 for handling and moving the common substrate 20 during various assembly steps.

Figure 2:
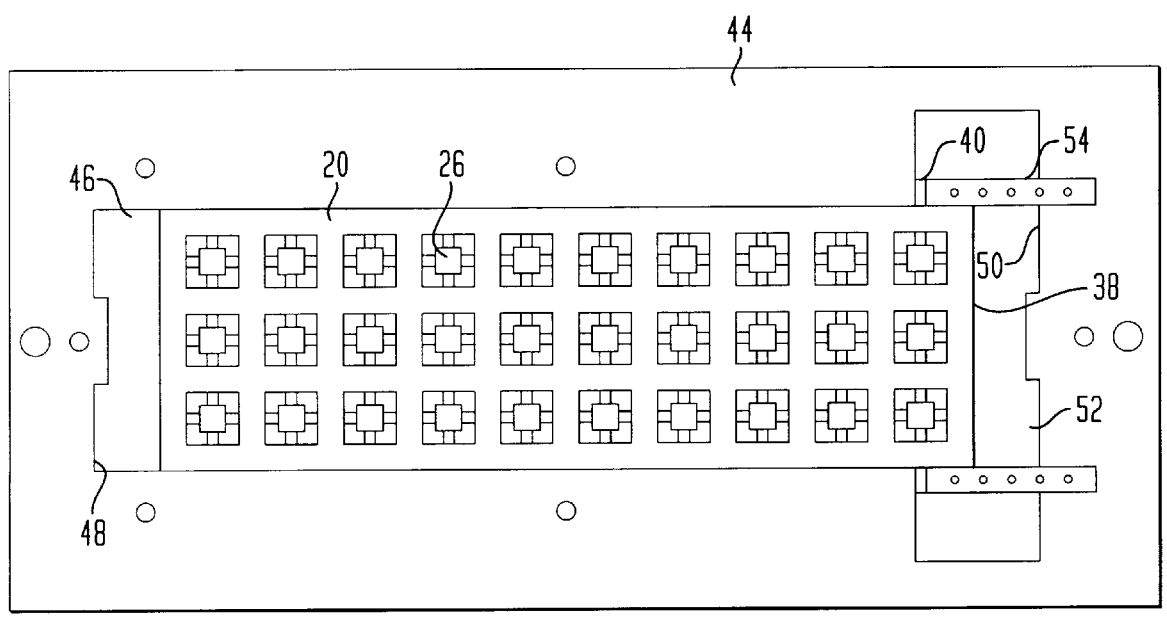
FIG. 2 shows the common substrate of FIG. 1A connected to a carrier frame according to preferred embodiments of the present invention.

Referring to FIG. 2, during assembly of microelectronic packages the common substrate is generally attached to a carrier frame 44, preferably by using the methods disclosed in copending, commonly assigned U.S. patent application Ser. No. 09/012,590, entitled "Universal Unit Strip/Carrier Frame Assembly and Methods", filed Jan. 23, 1998, the disclosure of which is hereby incorporated by reference herein. The carrier frame 44 facilitates handling of the common substrate 20 and assembly of microelectronic elements thereto. The carrier frame 44 includes an elongated slot 46 in the center thereof having a first end 48 and a second end 50 and first and second opposed sides which define one or more interior edges of the carrier frame 44. The carrier frame 44 also includes a cut out region 52 which is integral with the second end 50 of the slot 46, whereby the width of the cut out region 52 is greater than width of the slot 46. As shown in FIG. 2, the carrier frame 44 is preferably positioned over the common substrate 20 so that the slot 46 overlies the connection components 26 within the central region of the common substrate 20. The width of the common substrate 20 is greater than the width of the slot 46 so that the side borders 40 of the substrate 20 extend beyond the sides of the slot 46. However, the sides 40 at the second end 38 of the common substrate 20 are bound by the cut out region 52 so that the borders 40 are visible and can be accessed through the slot 46 in the carrier frame 44. The second end 38 of the common substrate 20 is then pivotally connected to the carrier frame 44 by placing flexible adhesive strips 54, such as polyimide tape strips, on the border regions 40 of the common substrate 20. The adhesive strips 54 have first ends which are attached to the common substrate 20 and second ends which are attached to the carrier frame 44.

Figure 3:
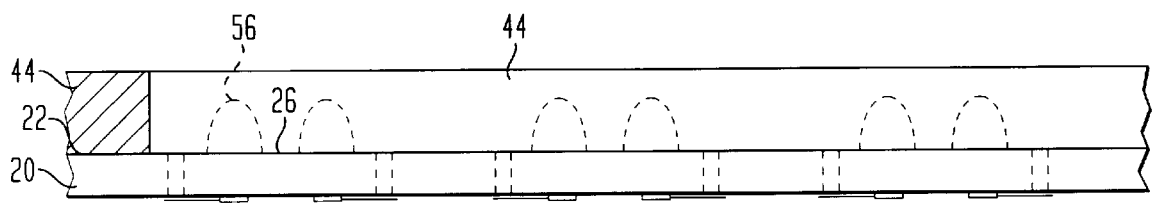
FIG. 3 shows a fragmentary side view of the common substrate and the carrier frame of FIG. 2 after a plurality of compliant pads have been assembled to a top surface of the common substrate.
Figure 4:
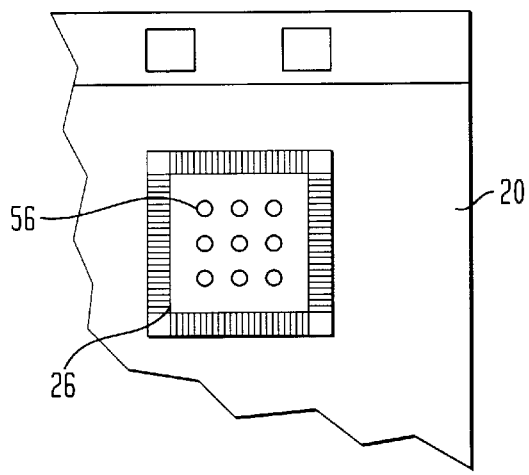
FIG. 4 shows a fragmentary top view of the common substrate of FIG. 3 including compliant pads assembled thereto.

Referring to FIG. 3, a plurality of compliant pads 56 may then be formed on each connection component 26 of the common substrate 20 by using the methods disclosed in commonly assigned U.S. Pat. No. 5,659,952, the disclosure of which is hereby incorporated by reference herein. FIG. 3 shows a fragmentary side view of the common substrate shown in FIG. 1A with only three of the connection components 26 being shown. As disclosed in the '952 patent, the compliant pads 56 are preferably stencil printed over each connection component 26 on the top surface 22 of the common substrate 20. After the compliant pads 56 have been provided on the connection components 26, the stencil (not shown) is removed and the compliant pads 56 are cured. FIG. 4 shows a top view of one connection component 26 after an array of compliant pads 56 have been formed thereon.

Figure 5:
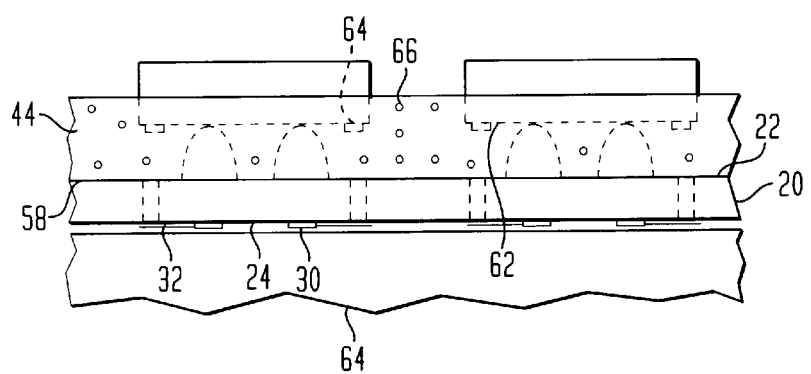
FIG. 5 shows a fragmentary side view of the common substrate of FIG. 3 including microelectronic elements assembled thereto.

Referring to FIG. 5, the common substrate 20, including the cured compliant pads 56 thereon, is then passed through the slot so that a bottom surface 58 of the carrier frame 44 engages the top surface 22 of the common substrate 20. As described in the above-mentioned '590 application, a pivoting apparatus may be used to pass the common substrate 20 through the slot 46. A plurality of semiconductor chips 60 are then assembled to the common substrate 20 by abutting front faces 62 of the semiconductor chips 60 against the compliant pads 56. Before the semiconductor chips 60 are assembled to the common substrate 20, a supporting plate 64 is typically placed in contact with the bottom surface 24 of the common substrate 20 to prevent undesirable movement and/or downward flexing of the common substrate 20 during chip assembly.

After the plurality of semiconductor chips 60 have been assembled to the common substrate 20, the carrier frame 44 is preferably inverted so that the second surface 24 of the common substrate 20 is accessible for bonding the flexible leads 32 to contacts 64 on the respective chips 60. After the flexible leads 32 have been bonded to the contacts 64, a curable liquid encapsulant 66 may be introduced between the plurality of semiconductor chips 60 and the common substrate 20 using the methods described in the '952 patent. The curable liquid encapsulant 66 is then preferably cured such as by using heat or ultraviolet light, to provide a compliant interface for the plurality of semiconductor chip packages.

After the encapsulant 66 has been cured, solder balls (not shown) are typically attached to the conductive terminals 30 accessible at the second surface 24 of the common substrate 20 so that the terminals 30 may be electrically interconnected with an external circuit element, such as a printed circuit board. One preferred method for attaching solder balls includes providing pads of a flux material over the terminals 30 and placing solder balls over the flux pads by using a stencil fixture having a plurality of apertures. After the solder balls have been disposed on the flux pads, the solder balls are reflowed to form a permanent bond with the terminals 30. The common substrate 20 and the reflowed solder balls may then be processed to remove excess flux therefrom, such as by immersing the common substrate 20 bearing the solder balls in a liquid alcohol solution for one minute in order to soften the excess flux. The common substrate 20 and terminals 30 are then scrubbed with a brush to remove the excess flux therefrom.

After the plurality of microelectronic elements 60 have been assembled to the common substrate 20 to provide a plurality of microelectronic packages, the individual microelectronic packages must be severed from the common substrate 20 to provide separate chip packages which may be incorporated into electronic devices. The common substrate 20 is preferably severed by using various embodiments of the cutting apparatus shown and described below. Referring to FIG. 6, before cutting the common substrate 20, the carrier frame 44 containing the plurality of microelectronic packages 68 is disposed on top of a cutting surface 70. The cutting apparatus 72 preferably includes a mechanical element 74, such as a programmed robotic element, which travels over a path defined on the common substrate 20. The mechanical element 74 preferably includes an optical element 76 which is capable of recognizing fiducial markings (FIG. 12) on the top surface 22 of the common substrate 20 for aligning the robotic element 74 over the common substrate 20 and guiding the robotic element 74 over the path defined on the common substrate 20. The fiducial markings 90 may include a set of registration marks in the corners of the common substrate 20 or may include a series of straight lines formed on the surface of the common substrate 20, such as one or more bus bars formed thereon. The cutting apparatus 72 also includes a castor element 78 having an upper end 80 which is pivotally mounted to the robotic element 78 and a lower end 82 which is remote therefrom. A cutting wheel 84 having a cutting edge 86 at the periphery thereof is rotatably mounted to the lower end 82 of the castor element 78 so as to provide a castoring action for the cutting wheel 84. The cutting edge may be formed symmetrically to the rotary plane of the cutting wheel or it may be formed asymmetrically or even flush on one side in order to produce cuts very close to the microelectronic packages being excised without disturbing any of the other microelectronic packages assembled to the common substrate.

During a cutting operation, the cutting edge 86 of the cutting wheel 84 engages the common substrate 20 and the cutting surface 70 whereby the cutting wheel 84 is subjected to lateral forces which may cause the cutting wheel 84 to divert from the path of the robotic element 74. These undesirable lateral forces tend to place undesirable forces on the substrate (e.g. bunching) and may result in the formation of erratic cut lines in the common substrate 20. These effects may be avoided by pivotally mounting the cutting wheel 84 to the robotic element 74 in a castored manner. The cutting wheel 84 essentially follows the mechanical element 74 in a straight motion rather than follow its own traction resulting from the cutting edge forming a groove in the cutting surface 70. The cutting surface 70 is preferably made of a cut resistant material, such as polyurethane, which is soft enough not to mar or dull the cutting edge 86 yet hard enough to avoid the production of a sizable groove therein when the cutting edge 86 is placed against it. As a result of the absence of grooves in the cutting surface 70, the cutting wheel 84 will not get caught in a groove which could result in the wheel being diverted from the path. The cutting surface preferably has a Shore A durometer rating of between 80–120.

Figure 7A:
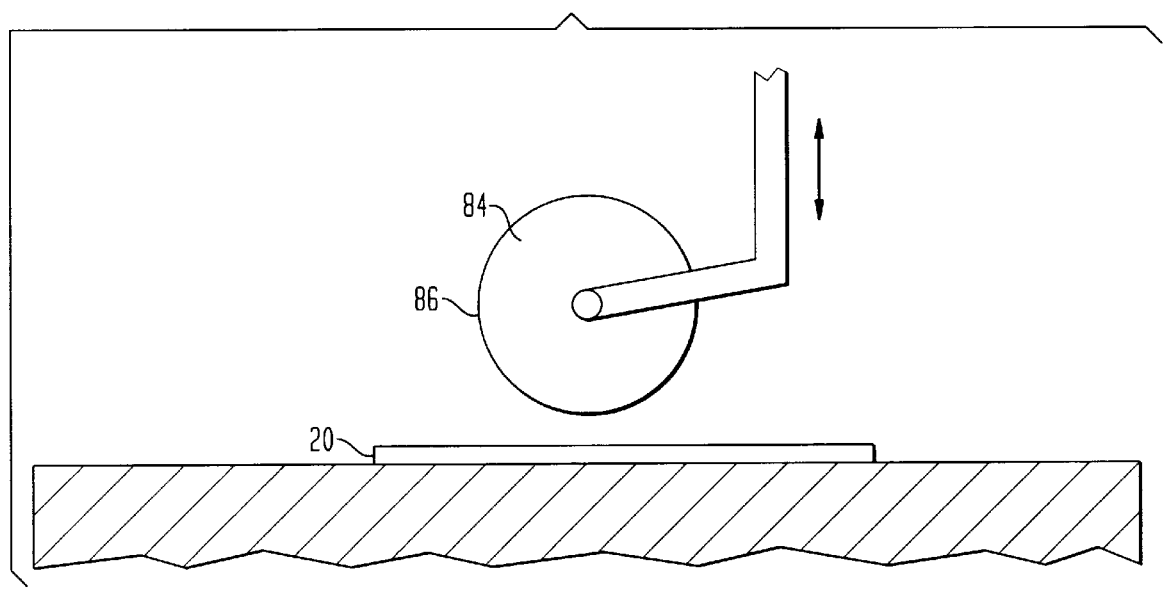
FIG. 7A shows a fragmentary side view of the cutting wheel shown in FIG. 6 in a first position remote from the common substrate.
Figure 7B:
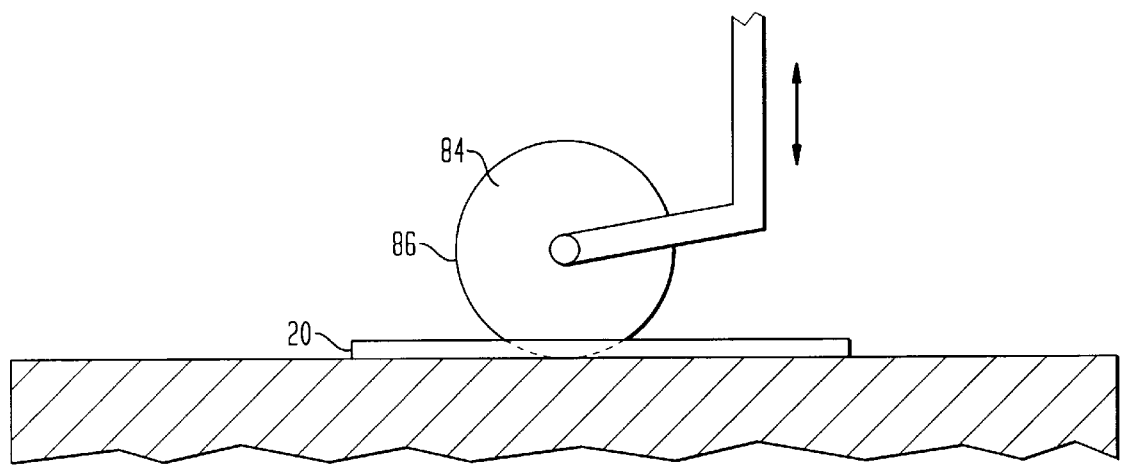
FIG. 7B shows a fragmentary side view of the cutting wheel shown in FIG. 6 in a second position in contact with the common substrate.

As shown in FIGS. 7A and 7B, the cutting apparatus 72 moves the cutting wheel 84 in a substantially Z-axis or vertical direction between a first position (FIG. 7A) in which the cutting wheel 84 is not in contact with the common substrate 20 and a second position (FIG. 7B) in which the cutting wheel 84 is in contact with the common substrate 20 for severing the substrate 20 between the plurality of microelectronic packages. When the cutting wheel is in the second position, (FIG. 7B), the mechanical element 74 typically exerts a downward force of approximately 6 to 10 pounds, however, the actual localized force exerted upon the common substrate by the cutting edge may be significantly larger because the actually area of contact is relatively small. The downward force may be modified depending upon a number of factors, such as the specific composition of the common substrate 20, the width of the cutting edge and the encapsulant.

Figure 8A:
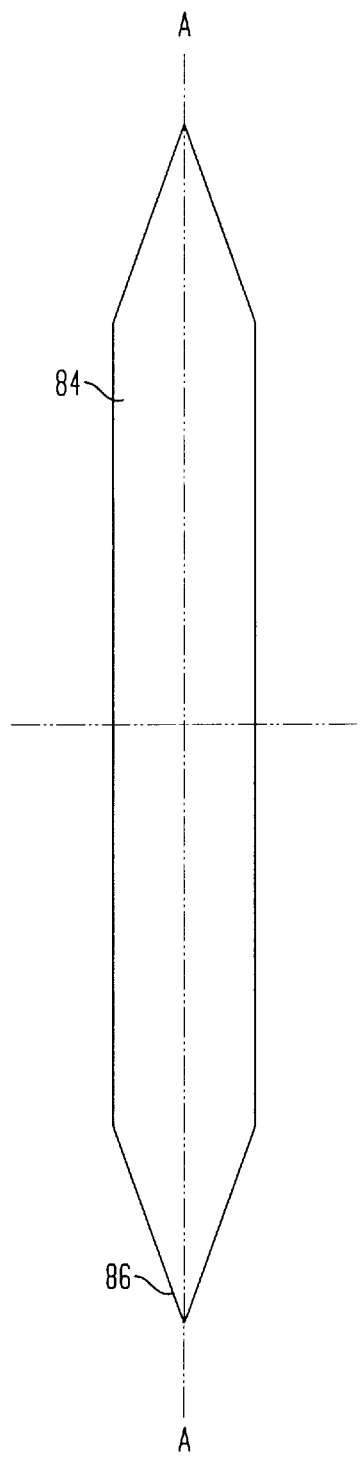
FIGS. 8A–8C show respective cross-sectional views of cutting wheels having cutting edges of various shapes according to preferred embodiments of the present invention.
Figure 8B:
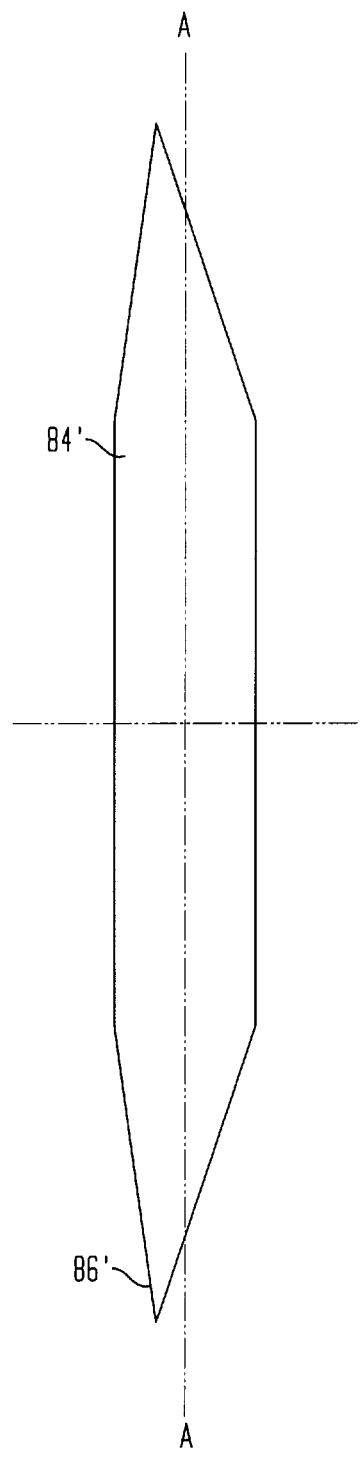
Figure 8C:
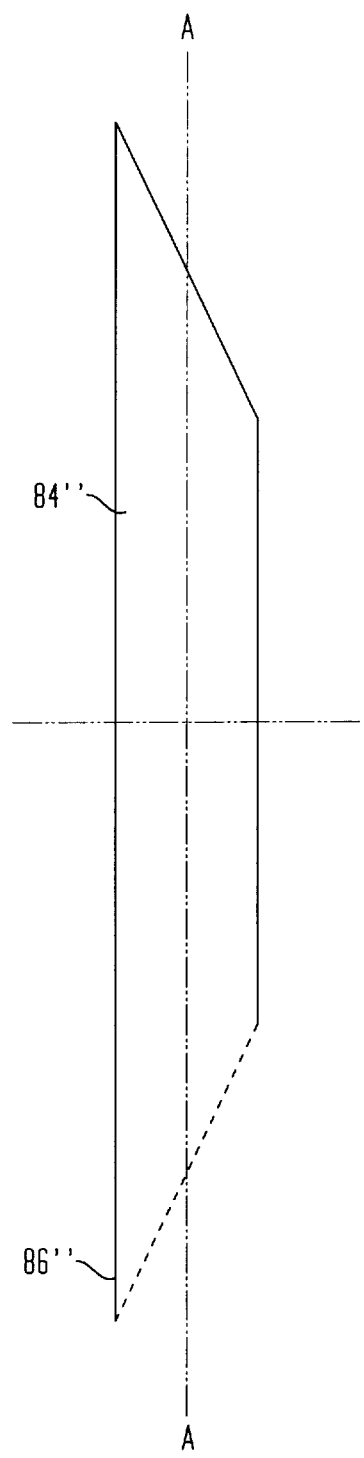

Referring to FIG. 8A, the cutting wheel 84 mounted to the castor element 78 preferably rotates within a plane which is parallel to an axis designated "A—A". Referring to FIGS. 8A–8C, the cutting edge 86 of the cutting wheel 84 may have a number of different shapes. As shown in FIG. 8A, the cutting wheel 84 has a cutting edge 86 which is formed symmetrically to the rotary plane "A—A" of the cutting wheel 84. FIGS. 8B and 8C show cutting wheels 84' and 84" having respective cutting edges 86' and 86" which are formed asymmetrically to their respective rotary planes "A—A".

Figure 9:
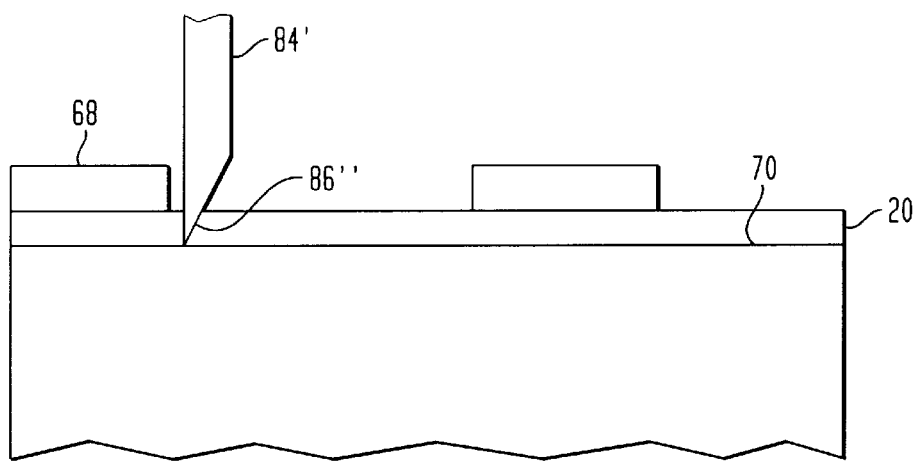
FIG. 9 shows a fragmentary side view of the cutting wheel of FIG. 8C while severing the common substrate according to preferred embodiments of the present invention.
Figure 10:
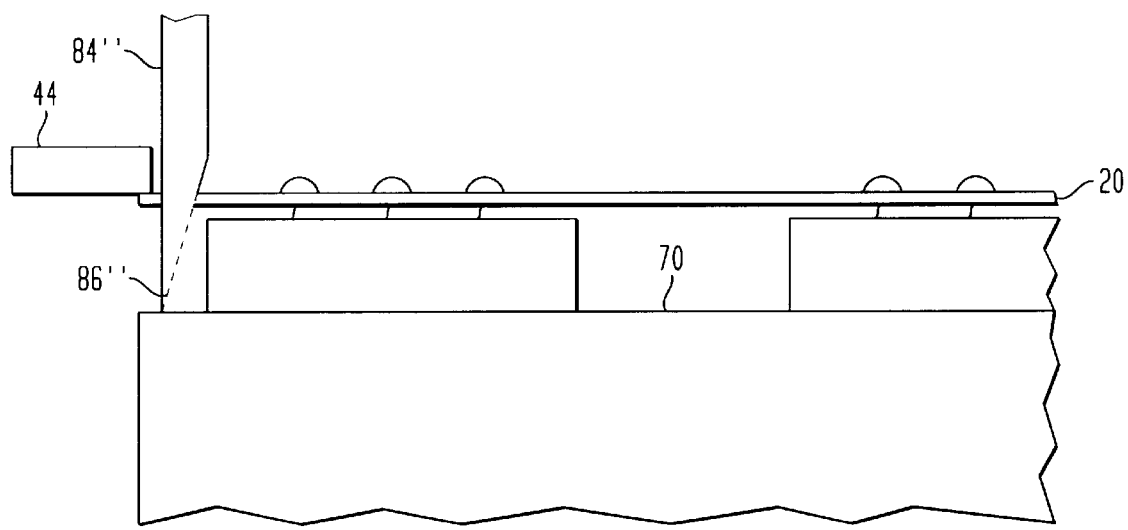
FIG. 10 shows a fragmentary side view of the cutting wheel of FIG. 8C while severing the common substrate according to further preferred embodiments of the present invention.

FIG. 9 shows one preferred method for cutting the common substrate whereby the common substrate 20 is placed directly in contact with the cutting surface 70. The FIG. 9 embodiment shows an asymmetrical cutting edge 86" which enables the cutting wheel 84" to pass closely by the periphery of an individual microelectronic package 68 without adversely affecting the ability of the cutting edge 86" to remain on the path defined on the common substrate 20. FIG. 10 shows another preferred embodiment for cutting the common substrate whereby the microelectronic package 68 is in contact with the cutting surface and the common substrate 20 is remote therefrom. FIG. 10 shows an assymetrical cutting edge 86" which enables the cutting blade 84" to pass closely by the carrier frame 44. Thus, the asymmetrical cutting edges shown in FIGS. 9 and 10 may be used to produce cuts very close to the microelectronic packages being separated without disturbing any of the other microelectronic packages assembled to the common substrate.

Figure 11:
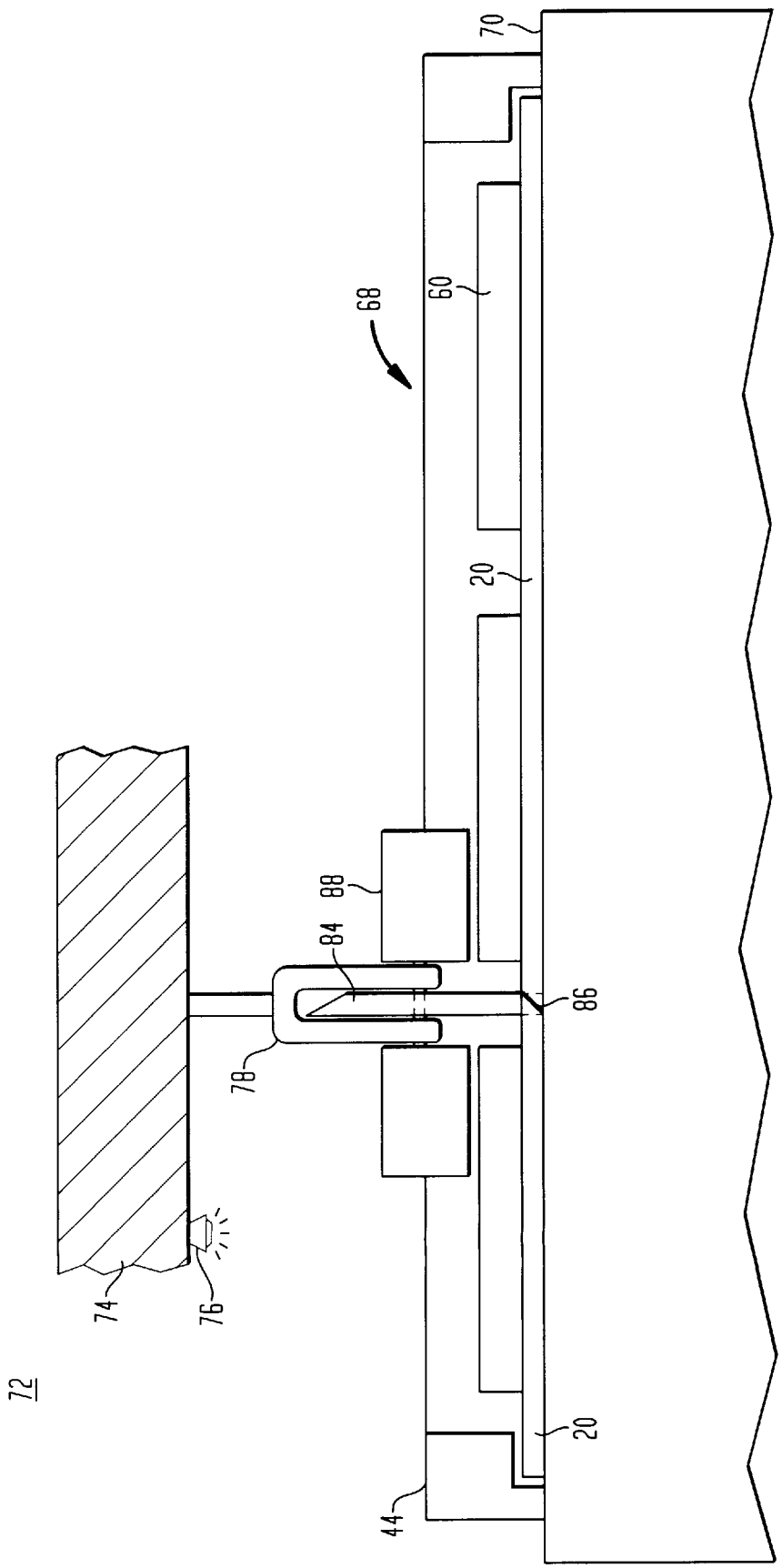
FIG. 11 shows a perspective side view of the cutting apparatus according to certain preferred embodiments of the present invention.

Referring to FIG. 11, in order to more reliably secure the common substrate 20 in place during a cutting operation, the cutting apparatus 72 may include support rollers 88 made of a compliant material, such as rubber or neoprene, mounted on either or both sides of the cutting wheel 84. The compliant support rollers 88 are preferably mounted on separate bearings from the bearings securing the cutting wheel 84 so that the support rollers 88 may rotate independently of the cutting wheel 84. The exact diameter of the compliant support rollers 88 is chosen so that the support rollers 88 press down on the chip packages on either or both sides of the path cut line, as the substrate 20 is being cut by the cutting wheel 84. The radius of the support rollers 88 is generally smaller than the radius of the cutting wheel 84 by about the thickness of the microelectronic packages 68. FIG. 11 shows a fragmentary view of three side-by-side microelectronic packages 68 with the cutting apparatus 72 in the second lowered position for cutting the common substrate 20. The compliant rollers 88 engage the packages 68 for applying a downward force on the packages to secure the common substrate in place.

The mechanical element 74 preferably supplies a downward force to the cutting wheel 84 so that the cutting edge 86 may cut through the common substrate 20. In certain preferred embodiments, the downward force is between about 6–10 pounds. The downward force may be developed using a spring or pneumatic means (not shown) which results in the cutting wheel 84 penetrating to a depth which is a function of the material composition of the common substrate 20, the encapsulant 66 and the cutting surface 70. In other preferred embodiments, the mechanical element 74 does not provide a particular downward force but is arranged to govern the range of downward movement of the cutting wheel 84. In other words, the mechanical element 74 limits downward movement of the cutting wheel so that the cutting edge 86 penetrates through the common substrate 20 to a predetermined depth without engaging or cutting into the cutting surface 70. The latter embodiment is preferably used when the cutting surface 70 includes a non-compliant material, such as metal, which would rapidly dull the cutting edge 86 were the cutting edge to come in contact therewith.

Figure 12:
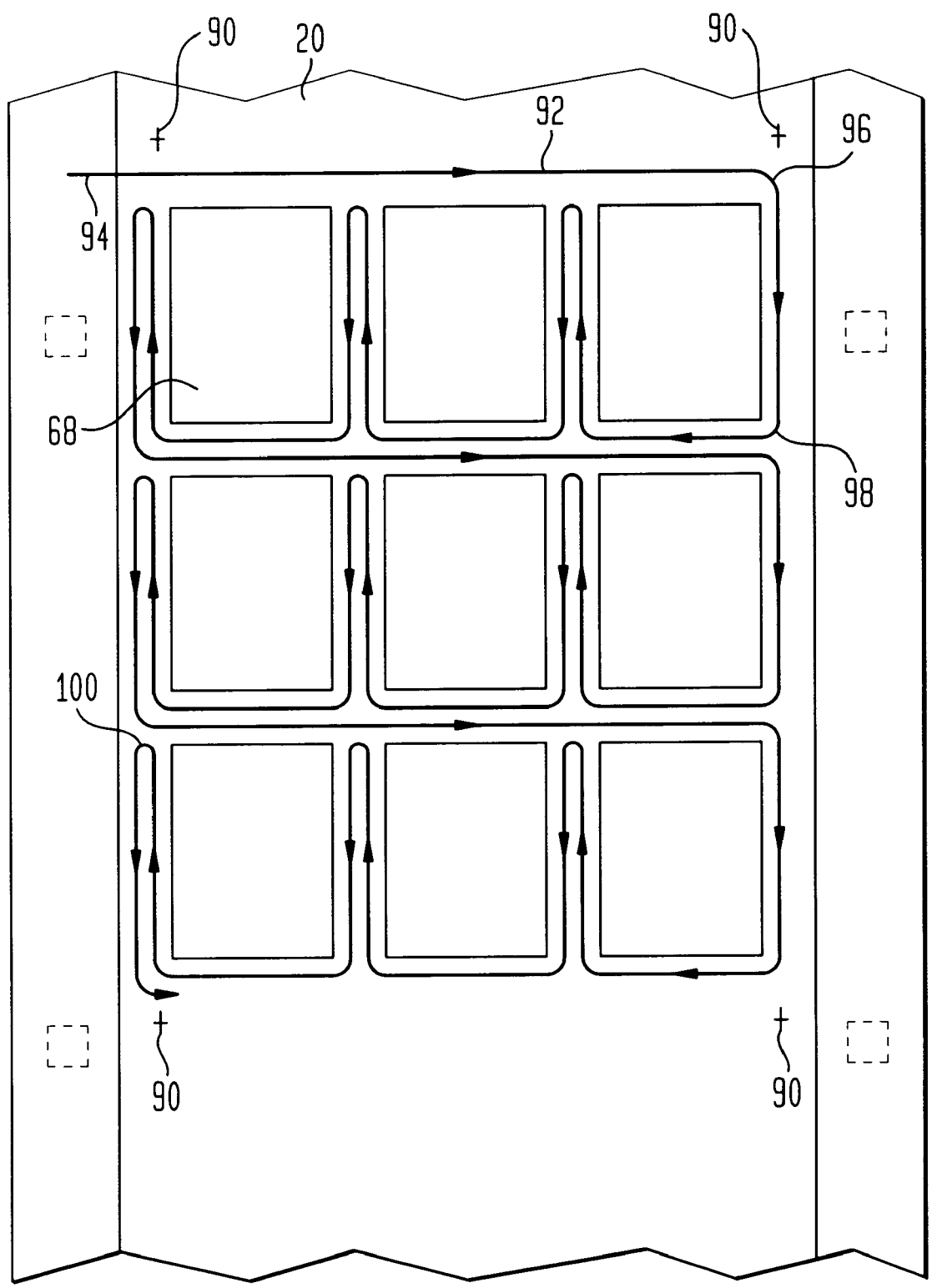
FIG. 12 shows a top view of a common substrate including fiducial markers and a path defined over the common substrate according to certain preferred embodiments of the present invention.

In operation, the mechanical element 74 guides the cutting wheel 84 along the path while exerting a downward force upon the cutting wheel 84 for cutting the common substrate 20. Referring to FIGS. 6 and 12, the common substrate 20 preferably has a series of fiducial markings 90 on the surface thereof. The optical element 76 faces the fiducial markings 90 for reading and recognizing the location of the fiducial markings 90. After determining the location of the fiducial markings 90, the optical element 76 forwards the data to a processing element (FIG. 13), such as a computer, in communication with the mechanical element 74. The processing element evaluates the data in a conventional manner to detect the position of substrate 20 and plots a preferred path 92 over the surface of the common substrate 20. The path 92 preferably includes a series of straight cut lines which traverse around the periphery of each of the microelectronic packages 68. The processing element then sends instructions to a moving element which lowers the mechanical element which, in turn, lowers the cutting wheel 84 so that the cutting edge 86 engages the common substrate 20. By way of example, the first pass of the cutting wheel 84 will sever the common substrate 20 from the location on the substrate designated 94 to the location designated 96. The cutting wheel 84 is then lifted up and away from the common substrate 20 so that the cutting edge 86 disengages from the common substrate 20. The robotic element 74 then rotates approximately 90° so that the cutting edge 86 is aligned for severing the common substrate 20 along a straight line between the substrate location designated 96 to location 98. The cutting wheel 84 is then lowered so that it re-engages the common substrate 20 and the cutting wheel is moved from location 96 to location 98. The operating steps described above are generally repeated until the cutting wheel has severed the common substrate along the entire path plotted over the substrate, i.e., from the location designated 94 to the location designated 100. When the cutting wheel 84 reaches the location designated 100, the plurality of microelectronic packages have been completely separated from one another and from the common substrate. The separate packages may then be removed using a "pick and place" machine and later assembled with electronic devices.

Figure 13:
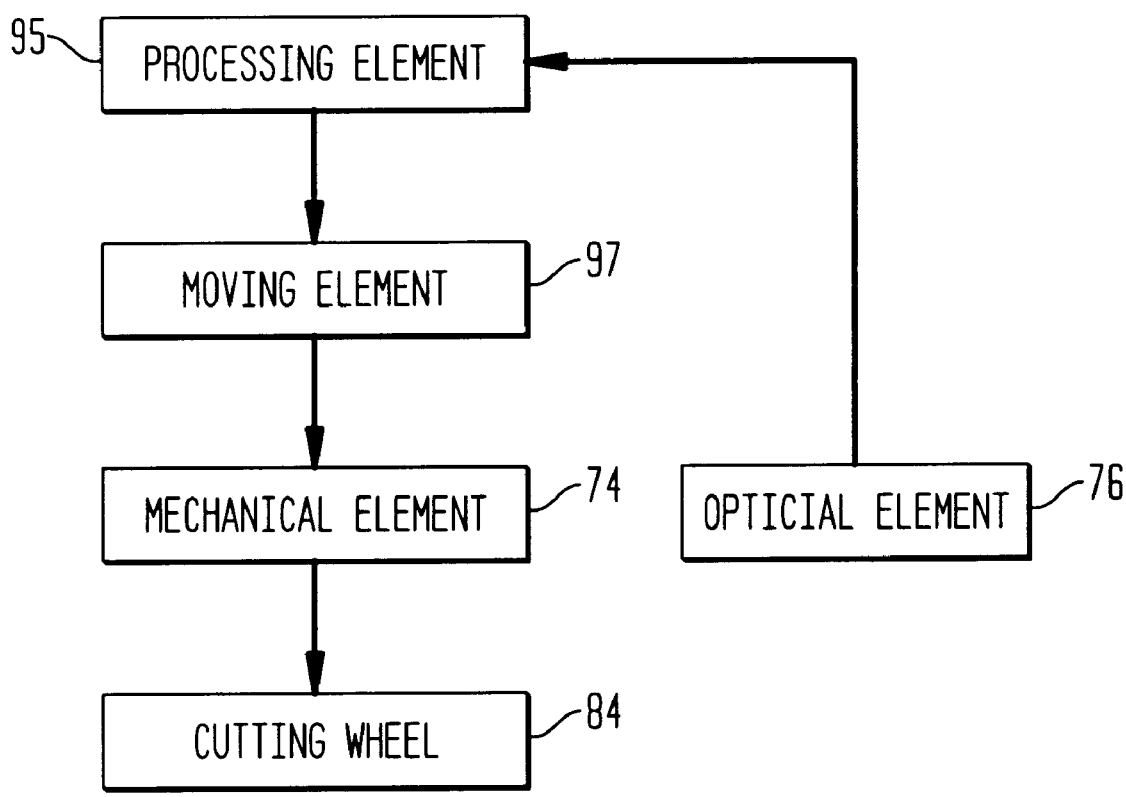
FIG. 13 shows a schematic view of a cutting apparatus according to one preferred embodiment of the present invention.

FIG. 13 shows a schematic view of the cutting apparatus described above. The cutting apparatus includes the cutting wheel 84 pivotally connected to the mechanical element 74. The optical eye 76 recognizes the fiducial markings on the common substrate (not shown) and relays data to the processing element 95. The processing element 95, in turn, processes the incoming data from the optical eye 76 in order to plot a cutting path over the common substrate and properly align the mechanical element 74 over the substrate. The processing element 95 then sends a series of signals to the moving element 97 which, in turn, moves the mechanical element 74 over the path plotted over the common substrate. As the mechanical element 74 moves over the path, the optical element 76 continues to send updated data to the processing element 95 in order to insure that the mechanical element 74 remains properly aligned and continues to follow the path.

Figure 14A:
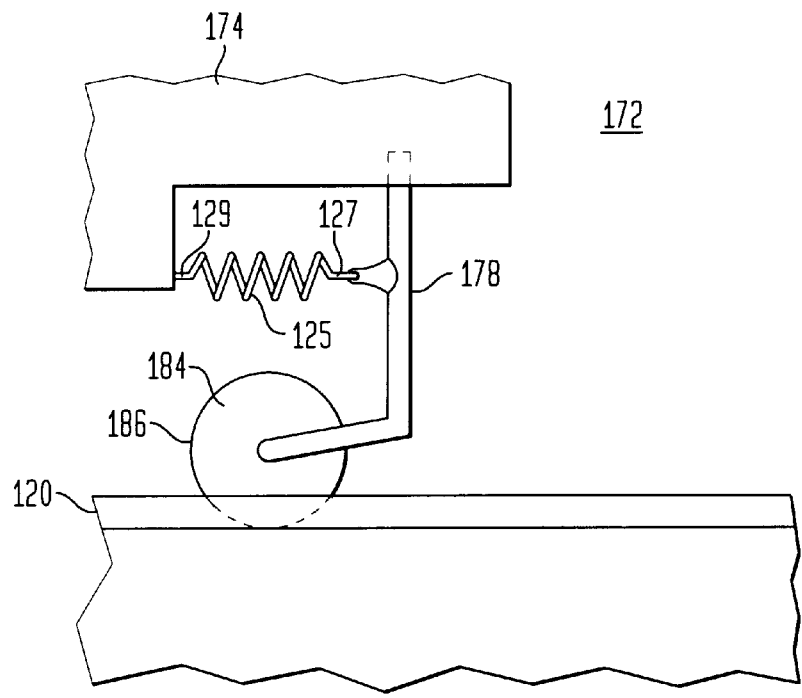
FIGS. 14A–14C show side and top views of the cutting apparatus including a biasing element according to certain preferred embodiments of the present invention.
Figure 14B:
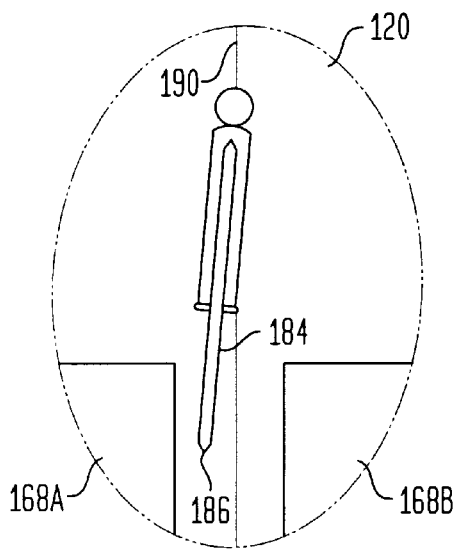
Figure 14C:
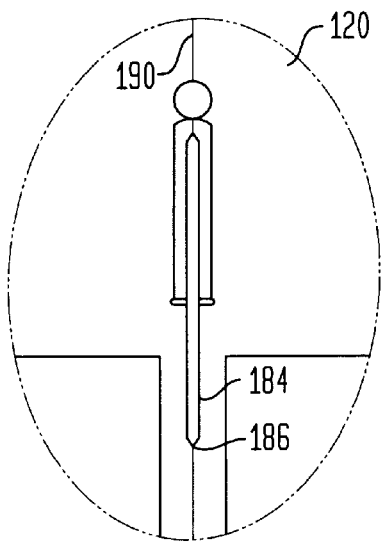

Referring to FIG. 14A, in certain preferred embodiments, the cutting apparatus 172 preferably includes a biasing element which resiliently urges the cutting edge 186 of the cutting wheel 184 to return to a known angular position (i.e. a position parallel to path) when the cutting wheel 184 is lifted off of the cutting surface 120. In the FIG. 14A embodiment, the biasing element includes a tension spring 125 having a first end 127 connected to the castor element 178 and a second end 129 connected to the robotic element 174. FIG. 14B shows a typical position of the cutting wheel 184 after the wheel has cut along the path 190 between two microelectronic packages 168A and 168B. As a result of lateral forces generated during the cutting operation, the cutting wheel 184 and cutting edge 186 do not lie in a plane which is parallel to the path 190. This non-parallel relationship may result in further divergence between the preferred path 190 and the actual cut line formed in the common substrate 120. Referring to FIGS. 14A and 14C, when the cutting wheel 184 is disengaged from the common substrate 120, the tension spring 125 resiliently urges and/or forces the cutting edge 186 back into a position which is parallel to the path 190 defined on the common substrate 120.

Figure 15A:
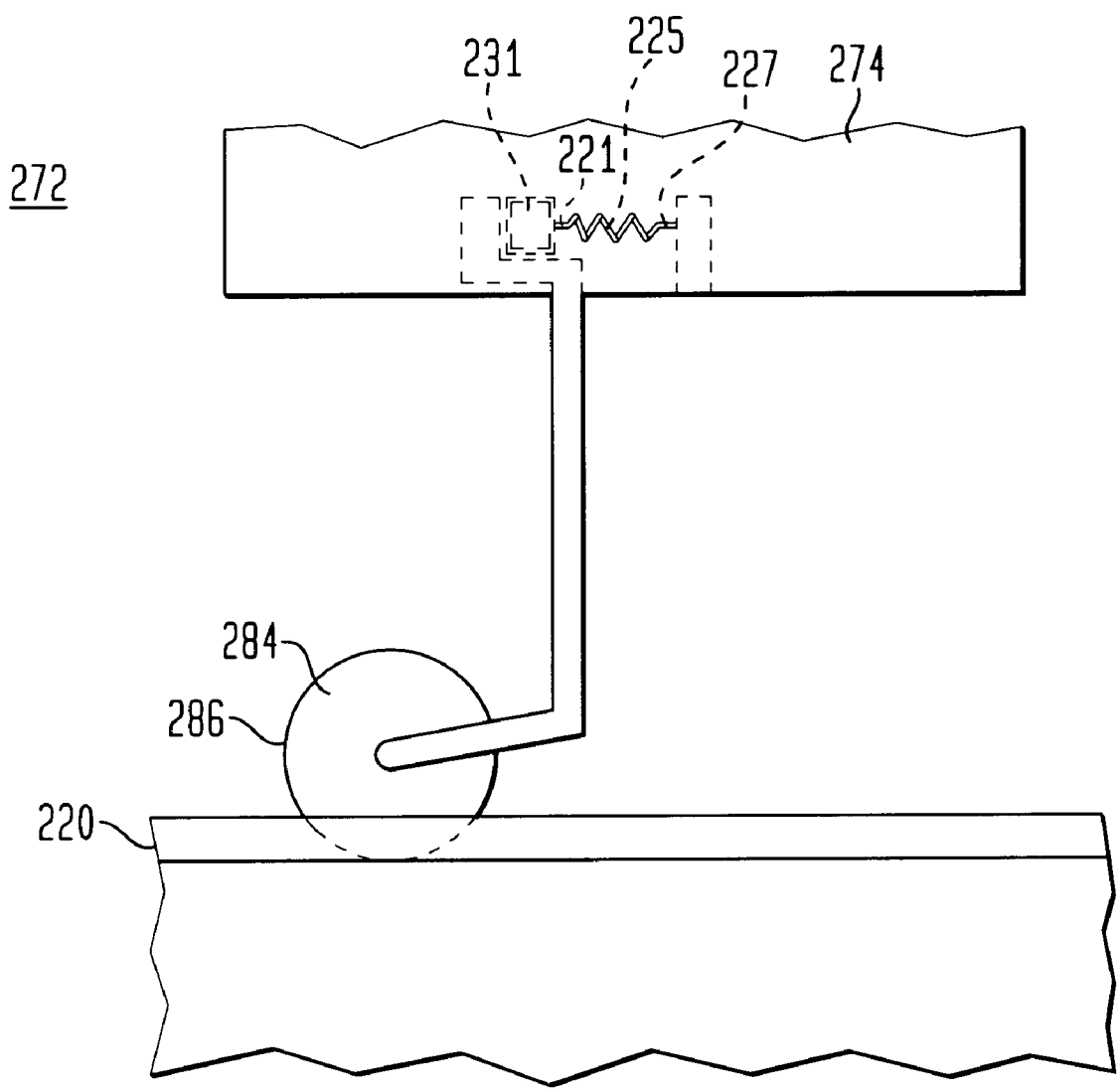
FIGS. 15A–15C show side and top views of the cutting apparatus including biasing element according to further preferred embodiments of the present invention.
Figure 15B:
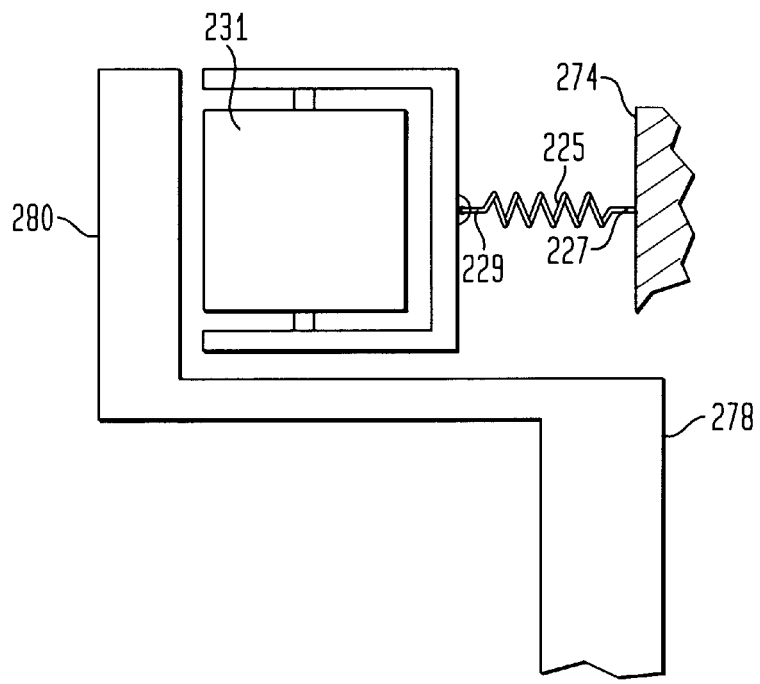
Figure 15C:
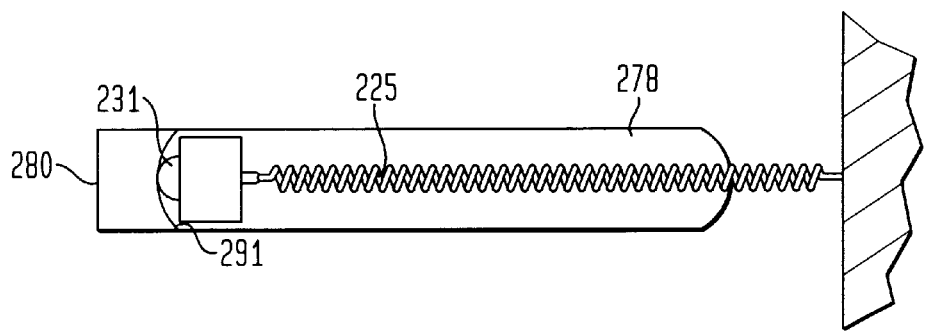

FIGS. 15A–15C show another preferred embodiment of the cutting apparatus 272 including a biasing element having a compression spring 225 and a cam follower 281. The compression spring 225 has a first end 227 which is connected to the mechanical element 274 and a second end 229 which is connected with the cam follower 231. As shown in FIG. 14C, the cam follower 231 engages a concave section 291 located at the upper end 280 of the castor element to resiliently urge the cutting edge 286 of the cutting blade 284 into a position parallel to the path defined on the common substrate 220. The biasing element may also include a rubber-like mount which provides compliance so as to allow the castor mounted cutting wheel to self steer when following the robotic elements track.

The castor element is preferably biased by a biasing element which resiliently urges or forces the cutting wheel into a known angular position when the cutting wheel is lifted upward away from the cutting surface and the common substrate. The biasing element such as a spring arrangement, a cam and cam follower arrangement or a rubber-like mount provides compliance thereby allowing the castor mounted cutting wheel to self steer when following the robotic arms track.

EXAMPLE

Figure 16:
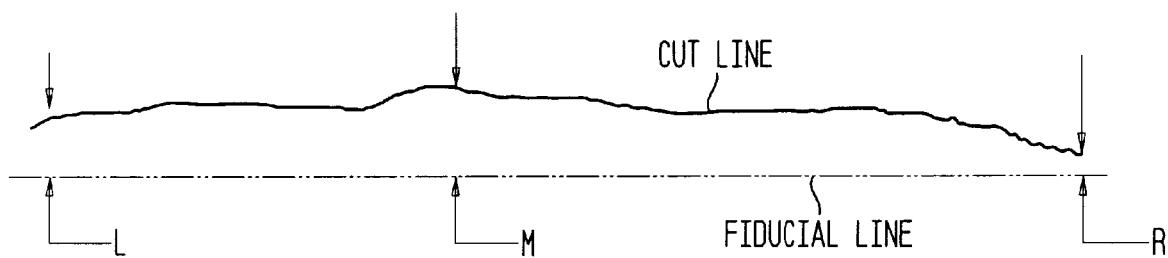
FIG. 16 shows a graph depicting the deviation of a cut line from the path defined on the surface of the common substrate.

In order to test the effectiveness of certain embodiments of the cutting apparatus described above, a common substrate including a plurality of microelectronic elements assembled thereto was provided on a cutting surface. The cutting surface included polyurethane having a Shore A durometer of between 80 to 120. The common substrate was fastened to the cutting surface using adhesive tape on the perimeter thereof. An embodiment substantially as shown and described in FIG. 6 was used to make six longitudinal cuts in the common substrate. After each pass of the cutting wheel, a piece of adhesive tape was placed over the cut in order to keep the severed parts of the common substrate in place as the individual microelectronic packages were separated from one another. After all six longitudinal cuts were made, the entire common substrate was removed from the cutting surface. A comparator was then used to measure the deviation of the straight lines actually cut (the "cut line") from the path plotted over the common substrate (the "fiducial line"). Three measurements were made for each cut line. As shown in FIG. 16, the letter "L" designates the extreme left end of the cut line, the letter "R" designates the extreme right end of the cut line and the letter "M" designates the middle of the cut line. The fiducial line was approximately 85.5 millimeters long. The deviation of the cut line from the fiducial line was calculated using the equation $dS=[(L+R)/2-M]$ and the deviation from parallelism was calculated using the equation $dP=(L-R)$. The results are provided below in $\mu m$.

| Strip No. | L | M | R | dP | dS |
|---|---|---|---|---|---|
| 1 | 209 | 199 | 236 | 25.0 | 23.5 |
| 2 | 74 | 47 | 73 | 1.0 | 26.5 |
| 3 | 333 | 319 | 315 | 18.0 | 5.0 |
| 4 | 303 | 371 | 419 | 26.0 | 35.0 |

As shown in the table, neither the deviation from parallelism (dP) nor the deviation from straightness (dS) exceeded ±35 $\mu m$. Acceptable tolerance constraints for the cut lines of typical microelectronic packages are ±50 $\mu m$. Thus, the cutting apparatus described herein greatly exceeds acceptable standards and may be used to accurately and reliably separate one or more microelectronic packages from a common substrate.

As will be appreciated, numbers variations and combinations of the features discussed above can be utilized without departing from the present invention as defined by the claims. Accordingly, the foregoing description of preferred embodiment should be taken by way of illustration rather than by way of limitation of the invention.

What is claimed is:

1. An apparatus for separating microelectronic packages assembled to a common substrate comprising:
   a mechanical element which is capable of traveling over a path defined on said common substrate;
   a castor element pivotally mounted to said mechanical element for movement about a pivot axis; and
   a cutting wheel rotatably mounted to said castor element so as to provide a castoring action for said cutting wheel, said cutting wheel having an asymmetrical cutting edge for selectively engaging said common substrate, wherein said mechanical element which is capable of guiding said cutting wheel over said path so that said cutting edge severs said common substrate to provide one or more of said microelectronic packages separate from one another.

2. The apparatus as claimed in claim 1, wherein said castor element has an upper end pivotally mounted to said mechanical element and a lower end which is remote therefrom, said cutting wheel being mounted to said lower end of said castor element.

3. The apparatus as claimed in claim 1, further comprising means connected to said mechanical element for moving said mechanical element over said path.

4. The apparatus as claimed in claim 1, wherein said cutting wheel is rotatably mounted for rotation about an axis of rotation, said axis of rotation being offset from said pivot axis.

5. The apparatus as claimed in claim 1, wherein said cutting wheel is rotatably mounted for rotation within a rotary plane.

6. The apparatus as claimed in claim 1, wherein each said microelectronic package includes one or more microelectronic elements assembled to a portion of said common substrate.

7. The apparatus as claimed in claim 6, wherein said one or more microelectronic elements includes a semiconductor chip.

8. The apparatus as claimed in claim 1, wherein said common substrate includes a flexible dielectric sheet.

9. The apparatus as claimed in claim 8, wherein said flexible dielectric sheet includes electrically conductive parts for electrically interconnecting one or more microelectronic elements and said dielectric sheet.

10. The apparatus as claimed in claim 1, further comprising an alignment system for aligning and guiding said cutting edge over said common substrate.

11. The apparatus as claimed in claim 10, wherein said alignment system includes one or more fiducial markers provided on said common substrate and an optical element for recognizing said fiducial markers.

12. The apparatus as claimed in claim 1, further comprising a cutting surface for supporting said common substrate.

13. The apparatus as claimed in claim 12, wherein said cutting surface includes a cut resistant material.

14. The apparatus as claimed in claim 13, wherein said cut resistant material includes polyurethane.

15. The apparatus as claimed in claim 12, wherein said cutting surface has a Shore A durometer of approximately 80–120.

16. The apparatus as claimed in claim 1, wherein the upper end of said castor element includes a shaft which pivots about an axis and the lower end of said castor element includes a connecting element for rotatably connecting said cutting wheel to said castor element.

17. The apparatus as claimed in claim 1, wherein said common substrate has a thickness.

18. A method for separating microelectronic packages assembled to a common substrate comprising the steps of:
   defining a path on said common substrate;
   providing a cutting apparatus including a cutting wheel having an asymmetrical cutting edge, said cutting wheel being castor mounted to said cutting apparatus;
   guiding said cutting wheel over said path;
   during the guiding step, engaging said common substrate with said cutting edge so as to sever said common substrate to provide one or more of said microelectronic packages separate from one another.

19. The method as claimed in claim 18, further comprising the step of securing said common substrate over a cutting surface before the defining step.

20. The method as claimed in claim 18, wherein the engaging step is perform so that each said microelectronic package includes a semiconductor chip.

21. The method as claimed in claim 18, further comprising providing a common substrate before defining a path on said common substrate, said common substrate including a flexible dielectric sheet.

22. The method as claimed in claim 18, wherein the providing said cutting apparatus comprises:
   arranging a mechanical element to travel over said path;
   pivotally mounting a castor element to said mechanical element for movement about a pivot axis; and
   rotatable mounting said cutting wheel to said castor element so as to provide a castoring action for said cutting wheel so that said cutting wheel follows said mechanical element while said mechanical element travels over said path.

23. The method of claim 22, wherein said guiding step includes maintaining said common substrate in a stationary position and moving said mechanical element relative to said common substrate.

24. The method of claim 22, further comprising the step of providing a downward force to said cutting wheel during the engaging step.

25. The method of claim 24, wherein said downward force is approximately 6–10 pounds.

26. A method for separating microelectronic packages assembled to a common substrate comprising:
   providing a cutting surface;
   providing said common substrate atop said cutting surface;
   defining a path on said common substrate;
   providing a cutting apparatus including a cutting wheel having a cutting edge, said cutting wheel being castor mounted to said cutting apparatus, wherein said cutting edge is asymmetrical so that said cutting wheel may pass closely by said microelectronic packages;
   guiding said cutting wheel over said path;
   during the guiding step, engaging said common substrate and said cutting surface with the cutting edge of said cutting wheel so as to sever said common substrate and separate one or more of said microelectronic packages from one another.

* * * * *

UNITED STATES PATENT AND TRADEMARK OFFICE
CERTIFICATE OF CORRECTION

PATENT NO. : 6,182,546 B1
DATED : February 6, 2001
INVENTOR(S) : Hecker

It is certified that error appears in the above-identified patent and that said Letters Patent is hereby corrected as shown below:

Column 1, line 58, after "such" insert --as--.
Column 4, line 11, change "engage" to --engages--.
Column 4, line 21, change "secured" to --secures--.
Column 6, line 38, after "including" insert --a--.
Column 13, line 3, change "embodiment" to --embodiments--.
Column 13, line 16, after "element" delete "which".
Column 14, line 22, change "perform" to --performed--
Column 14, line 28, after the second occurrence of "the", insert --step of--.
Column 14, line 33, change "rotable" to rotatably--.

Signed and Sealed this

Fifth Day of June, 2001

*Attest:*

NICHOLAS P. GODICI
*Attesting Officer*   *Acting Director of the United States Patent and Trademark Office*